United States Patent [19]
Dow et al.

[11] Patent Number: 6,153,532
[45] Date of Patent: Nov. 28, 2000

[54] METHODS AND APPARATUSES FOR REMOVING MATERIAL FROM DISCRETE AREAS ON A SEMICONDUCTOR WAFER

[75] Inventors: Daniel B. Dow; Richard H. Lane, both of Boise, Id.

[73] Assignee: Micron Technology, Inc., Boise, Id.

[21] Appl. No.: 09/032,212

[22] Filed: Feb. 27, 1998

[51] Int. Cl.[7] .................. H01L 21/302; H01L 21/461
[52] U.S. Cl. ............................. 438/745; 438/748
[58] Field of Search ..................... 438/745, 748, 438/754, 975; 156/345; 118/669, 624; 216/90, 91, 92

[56] References Cited

U.S. PATENT DOCUMENTS

| | | | |
|---|---|---|---|
| 3,597,289 | 8/1971 | Kohl et al. | 438/748 |
| 4,836,132 | 6/1989 | Marzullo | 118/264 |
| 5,001,084 | 3/1991 | Kawai et al. | 438/748 |
| 5,185,056 | 2/1993 | Fuentes et al. | 438/748 |
| 5,271,798 | 12/1993 | Sandhu et al. | 156/638 |
| 5,743,959 | 4/1998 | Ash et al. | 118/264 |

*Primary Examiner*—Benjamin L. Utech
*Assistant Examiner*—Duy-Vu Deo
*Attorney, Agent, or Firm*—Wells, St. John, Roberts, Gregory & Matkin

[57] ABSTRACT

Methods and apparatuses for removing material from discrete areas on a semiconductor wafer are described. In one implementation, an etchant applicator is provided having a tip portion. Liquid etchant material is suspended proximate the tip portion and the etchant applicator is moved, together with the suspended liquid, sufficiently close to a discrete area on a wafer to transfer liquid etchant onto the discrete area. In various embodiments the tip portion can comprise fluid permeable materials, fluid-absorbent materials, and/or wick assemblies. An exhaust outlet can be provided operably proximate the tip portion for removing material from over the wafer. The tip portion can be moved to touch the discrete area.

50 Claims, 8 Drawing Sheets

METHODS AND APPARATUSES FOR REMOVING MATERIAL FROM DISCRETE AREAS ON A SEMICONDUCTOR WAFER

TECHNICAL FIELD

This invention relates to methods and apparatuses for removing material from discrete areas on a semiconductor wafer, and in particular to methods and apparatuses for removing material from over alignment marks on a wafer.

BACKGROUND OF THE INVENTION

It is sometimes desirable in semiconductor device manufacturing to remove material from over discrete wafer areas, without exposing other wafer areas to the etchant solutions. One type of discrete area includes alignment marks which are used to align wafers during processing. Alignment marks are preferably kept substantially clear of contaminants or material so that processing equipment can easily locate them. Alignment marks can get covered with a variety of material including photoresist, etched substrate material, and chemical mechanical polishing slurry or a variety of thin films. When alignment marks get covered with material, it is desirable to remove the material. Methods and apparatuses for removing material from over alignment marks are described in U.S. Pat. No. 5,271,798, which is assigned to the assignee of this document, the disclosure of which is incorporated by reference.

This invention arose out of concerns associated with providing improved methods and apparatuses for removing material from discrete areas, e.g. alignment marks, on a semiconductor wafer.

SUMMARY OF THE INVENTION

Methods and apparatuses for removing material from discrete areas on a semiconductor wafer are described. In one implementation, an etchant applicator is provided having a tip portion. Liquid etchant material is suspended proximate the tip portion and the etchant applicator is moved, together with the suspended liquid, sufficiently close to a discrete area on a wafer to transfer liquid etchant onto the discrete area. In various embodiments the tip portion can comprise fluid permeable materials, fluid-absorbent materials, and/or wick assemblies. An exhaust inlet can be provided operably proximate the tip portion for removing material from over the wafer. The tip portion can be moved to touch the discrete area.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
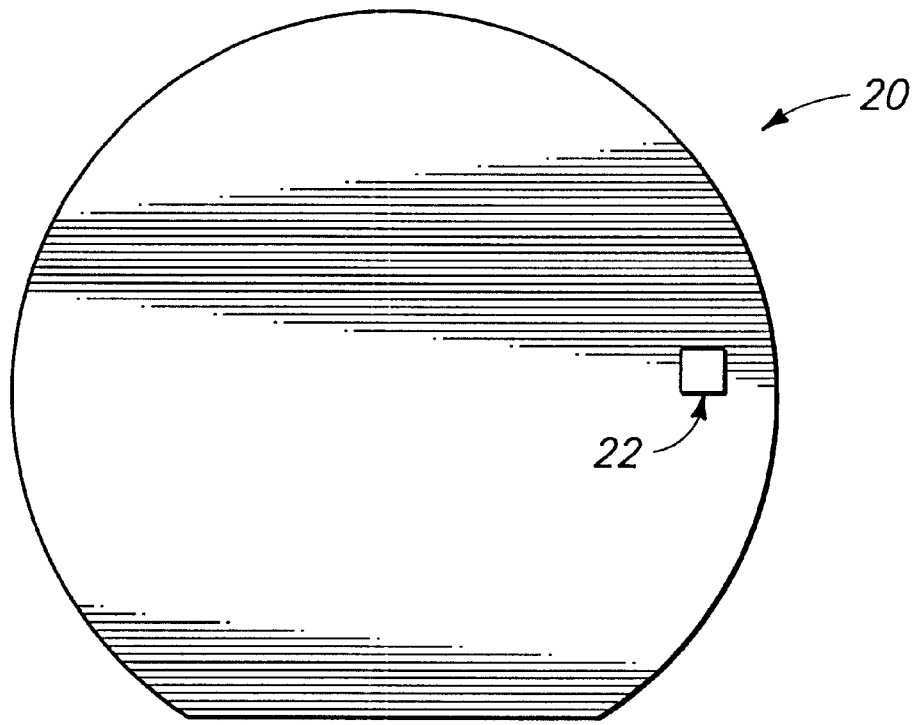
FIG. 1 is a top plan view of a semiconductor wafer showing an exemplary discrete area.
Figure 2:
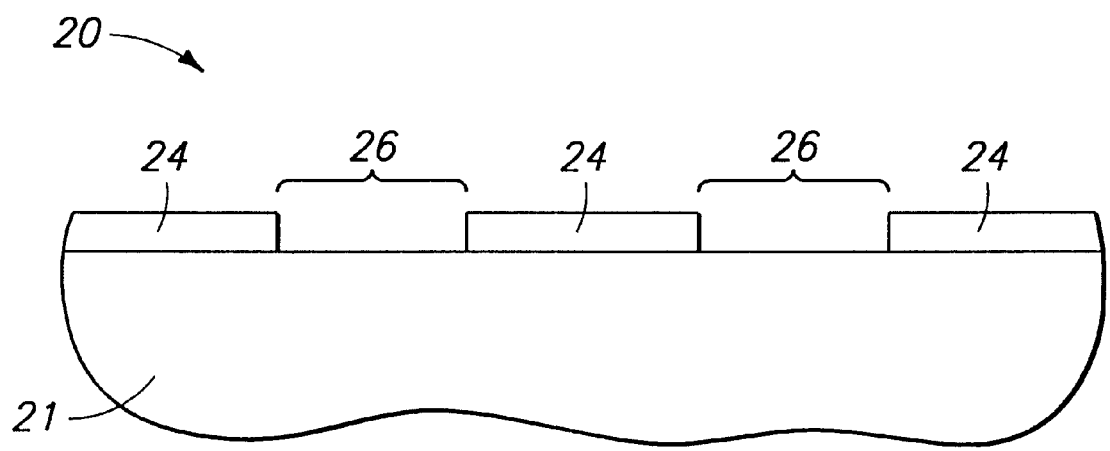
FIG. 2 is a diagrammatic side sectional view of an exemplary discrete area comprising alignment marks.

Referring to FIGS. 1 and 2, a semiconductor wafer is shown generally at 20 and comprises a semiconductive substrate 21. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 21 includes a discrete area 22 from which material is desired to be removed. Discrete area 22 can comprise any area from over or within which material is desired to be removed, while not subjecting other substrate areas to the removal media or etchant which is used. In the preferred embodiment, discrete area 22 comprises an area containing alignment marks.

Referring to FIG. 2, a layer 24 is formed over substrate 21 and patterned to define alignment marks 26 which, in this example, are formed over a discrete area of wafer 20.

Figure 3:
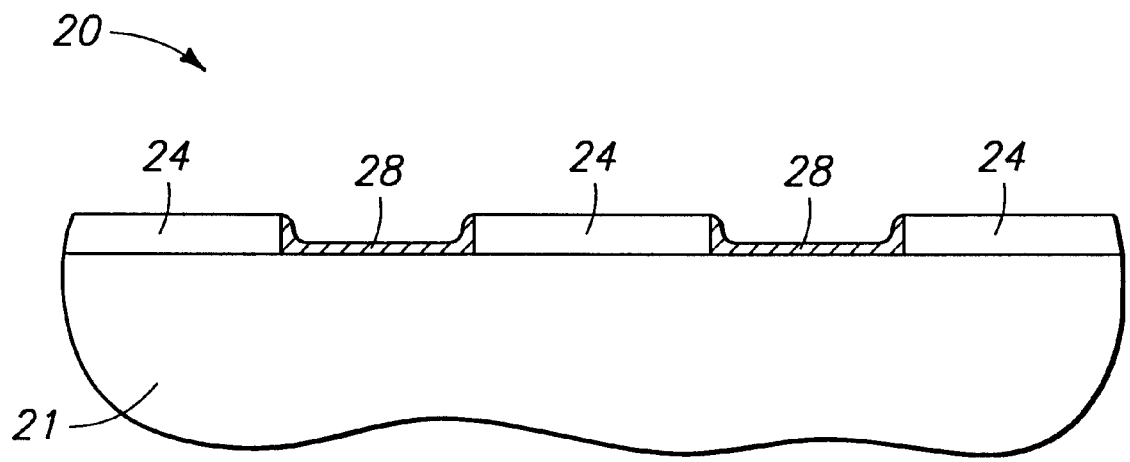
FIG. 3 is a view of the FIG. 2 wafer fragment at a processing step subsequent to that shown in FIG. 2.

Referring to FIG. 3, a material has been formed over the wafer and the surface has been planarized, typically by using a chemical mechanical planarization process leaving residue 28 over the substrate and within alignment marks 26. Residue 28 can comprise any residual material. In this example, such material can include chemical mechanical planarization process slurry material, a refractory metal, a photoresist, dielectric material, polysilicon material, e.g., any residue from a semiconductor manufacturing process which might be present in or over alignment marks 26. In a preferred embodiment, residue 28 comprises an oxide film which is subsequently removed.

Figure 4:
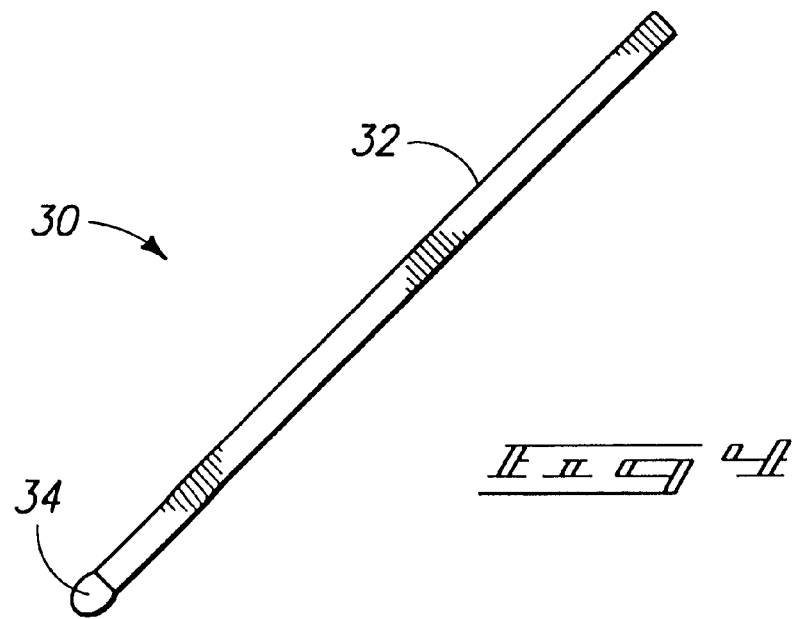
FIG. 4 is a side elevational view of an etchant applicator constructed in accordance with one embodiment of the present invention.

Referring to FIG. 4, an etchant applicator in accordance with one embodiment of the invention is shown generally at 30 and includes a stem portion 32 and a tip portion 34 connected therewith. Stem portion 32 can be dimensioned to be gripped or held by an individual during use. Stem portion 32 can also be configured for automated use by processing equipment. Liquid etchant material is provided over tip portion 34 which can then be used to treat a discrete area on a wafer. Any liquid etchant material can be used, and an exemplary material comprises hydrofluoric acid utilized in concentrations which are normally used during etching of various materials.

Referring to FIGS. 5–8, four exemplary tip portions are shown respectively at 34a, 34b, 34c and 34d.

Figure 5:
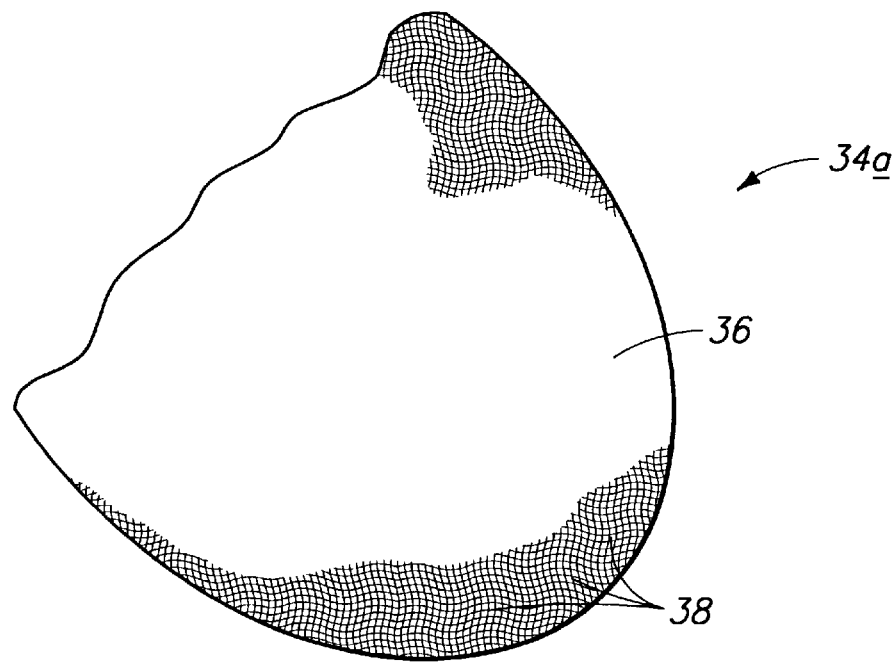
FIG. 5 is a view of a tip portion of the FIG. 4 applicator in accordance with one embodiment of the invention.

Referring to FIG. 5, tip portion 34a comprises a fluid-permeable material 36. As used in the context of this document, the term "fluid-permeable material" is intended to include materials which are capable of holding or being penetrated with liquid etchant materials. Penetration can occur through openings, pores, interstices, spaces and/or other similar structure in the material. Such materials include those through which liquid etchant material diffuses, pervades, absorbs, and/or saturates. Accordingly, material 36 can include fibrous material such as a plurality of fibrous members or fibers 38. Exemplary fibrous members include Teflon™ or Gortex™ fibers.

Figure 6:
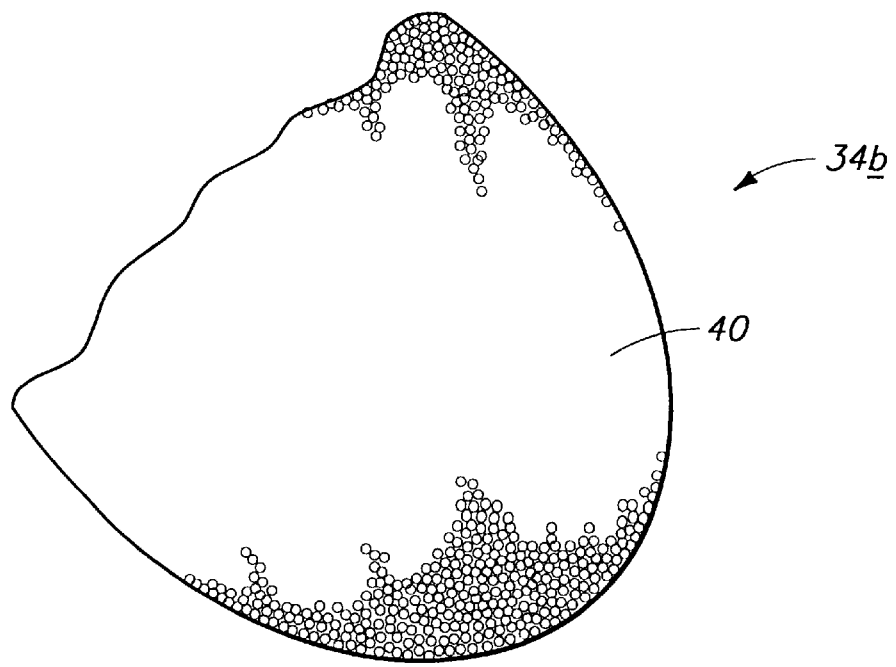
FIG. 6 is a view of a tip portion of the FIG. 4 applicator in accordance with another embodiment of the invention.

Referring to FIG. 6, tip portion 34b comprises a fluid-absorbent material 40. As used in the context of this document, the term "fluid-absorbent material" is intended to include materials which are capable of taking up or drinking in liquid etchant material.

Figure 7:
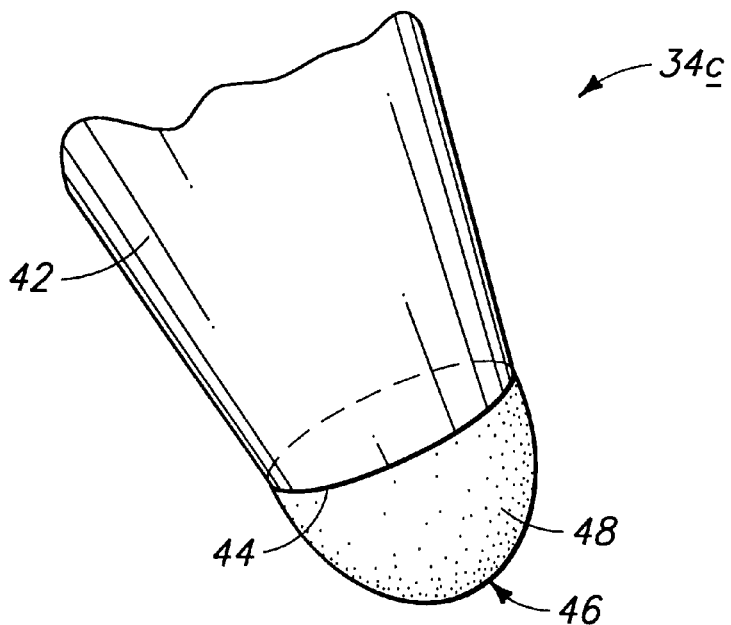
FIG. 7 is a view of a tip portion of the FIG. 4 applicator in accordance with another embodiment of the invention.

Referring to FIG. 7, tip portion 34c includes a body 42 having a hollow opening 44 into a cavity in which a portion of a droplet 46 is disposed. A projected portion 48 of droplet 46 projects outward of hollow opening 44 and is suspended or clung onto tip portion 34c for purposes which will become evident below.

Figure 8:
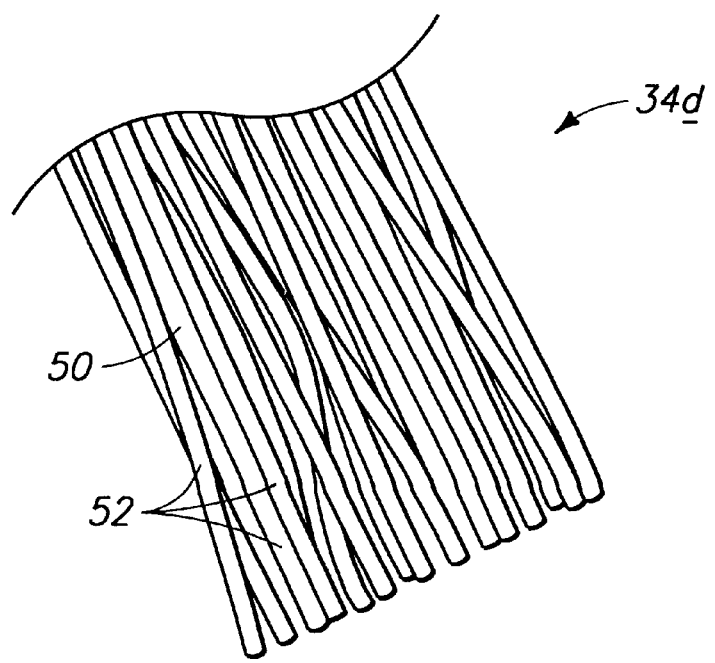
FIG. 8 is a view of a tip portion of the FIG. 4 applicator in accordance with another embodiment of the invention.

Referring to FIG. 8, tip portion 34d comprises a wick assembly 50 having a plurality of fibers or fibrous members 52. Wick assembly 50 comprises material which is configured to receive an amount of liquid etchant through wicking action. Accordingly, exemplary materials for wick assembly 50 include fluid-permeable materials and fluid-absorbent materials such as those mentioned above.

Figure 9:
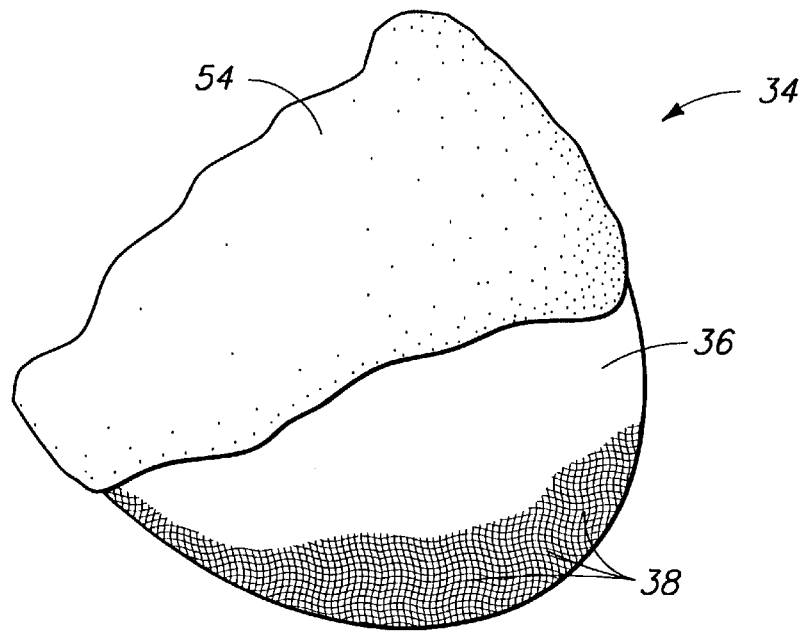
FIG. 9 is a view of a tip portion of the FIG. 4 applicator, undergoing processing in accordance with one or more embodiments of the present invention.
Figure 10:
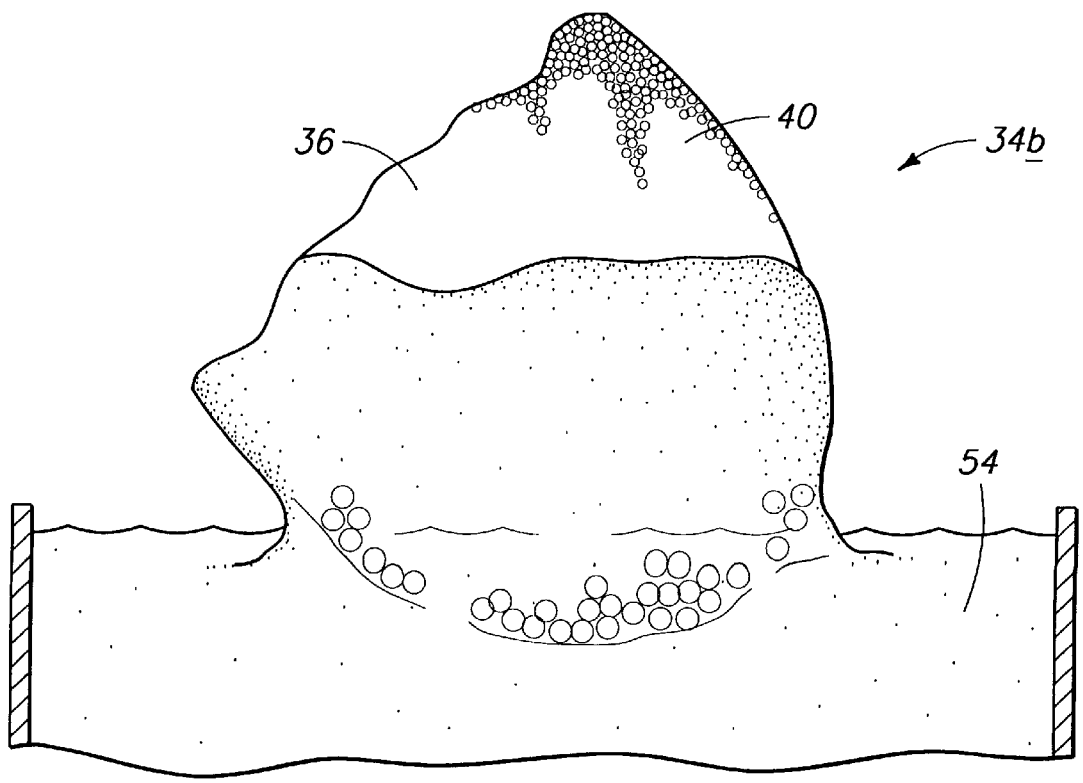
FIG. 10 is a view of a tip portion of the FIG. 4 applicator, undergoing processing in accordance with one embodiment of the present invention.

Referring to FIGS. 9 and 10, an amount of liquid etchant 54 is provided over tip portions 34, 34b respectively. Tip portion 34 can include any of the above-described tip portions (FIGS. 5–8), and liquid etchant 54 can be provided thereover in any suitable way. For example, liquid etchant 54 can be absorbed into, within, onto or through the material comprising tip portion 34. In this way, liquid etchant material can be clung onto, supported by, or suspended by the tip portion. In FIG. 10, liquid etchant material is provided over tip portion 34b by dipping or immersing some or all of the tip portion into an amount of liquid etchant 54. The liquid etchant is absorbed by tip portion 34b. As the liquid etchant is absorbed by tip portion 34b, the illustrated pores (not specifically designated) expand slightly in a sponge-like fashion.

Figure 11:
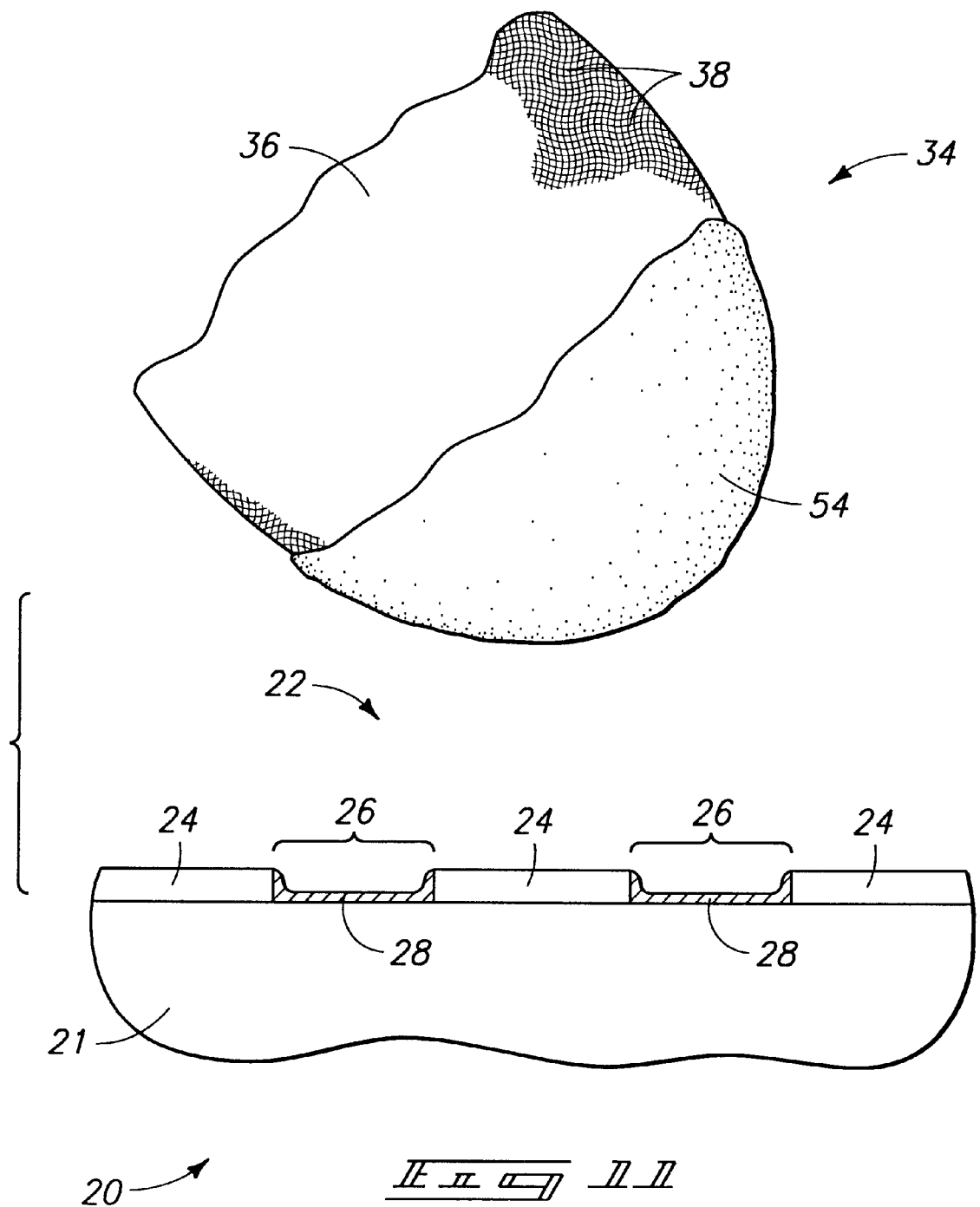
FIG. 11 is a view of a tip portion of the FIG. 4 applicator, positioned proximate the FIG. 3 wafer fragment.

Referring to FIG. 11, the etchant applicator, including tip portion 34 (not necessarily shown to scale), is moved into proximity with a discrete area 22.

Figure 12:
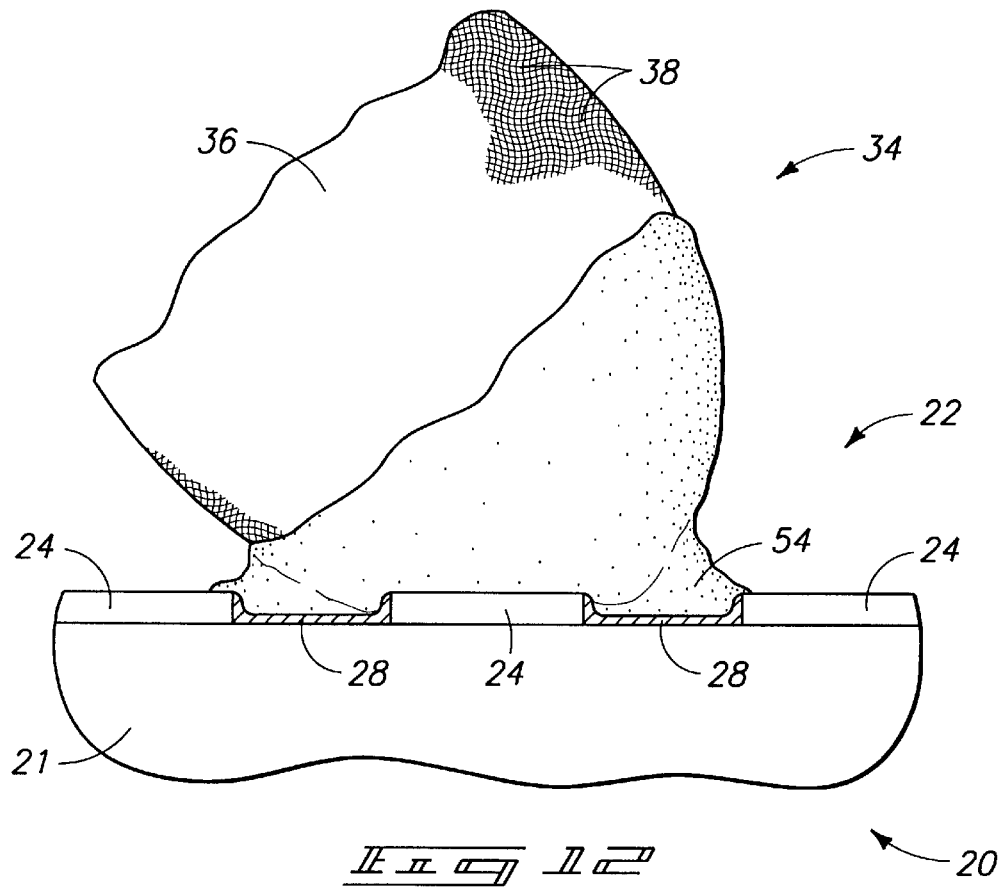
FIG. 12 is a view of the FIG. 3 wafer fragment undergoing processing in accordance with one embodiment of the invention.
Figure 13:
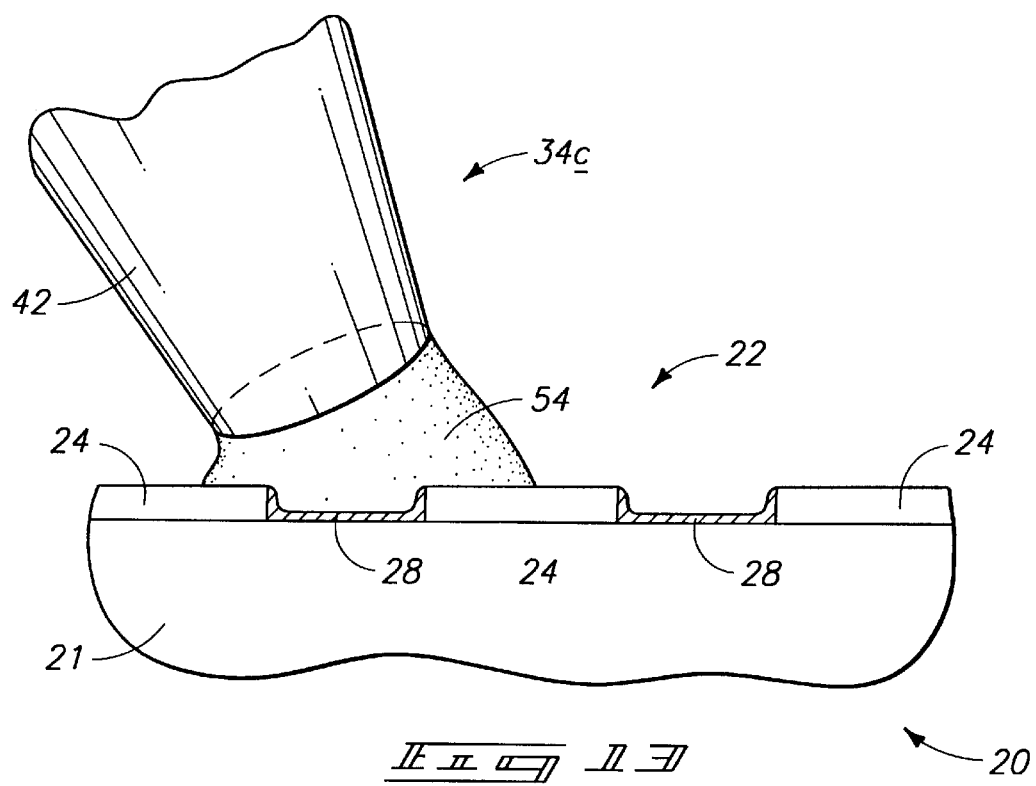
FIG. 13 is a view of the FIG. 3 wafer fragment undergoing processing in accordance with one embodiment of the invention.

Referring to FIGS. 12 and 13, liquid etchant material 54 is transferred from tip portion 34 onto discrete area 22. In a first embodiment (FIG. 12), tip portion 34 is moved or placed, together with the suspended or clung liquid etchant material, sufficiently close to discrete area 22, e.g. touching the discrete area, to transfer at least some of material 54 onto the discrete area. Such constitutes one example of placing the tip portion into proximity with discrete area 22 sufficiently to bring at least some of the etchant material into physical contact with discrete area 22. Removing tip portion 34 thereafter leaves at least some etchant material 54 behind on the wafer.

Referring to FIG. 13, tip portion 34c is moved sufficiently close to discrete area 22 to transfer at least some of the suspended or clung liquid etchant material 54 onto discrete area 22. In this example, the tip portion is placed into proximity with the discrete area without physically touching or contacting the discrete area. Removal of the tip portion thereafter results in at least some of the etchant material being left behind on the wafer. Tip portion 34c is used in this example for illustrative purposes only. Other above-described tip portions could be used in this manner.

Figure 14:
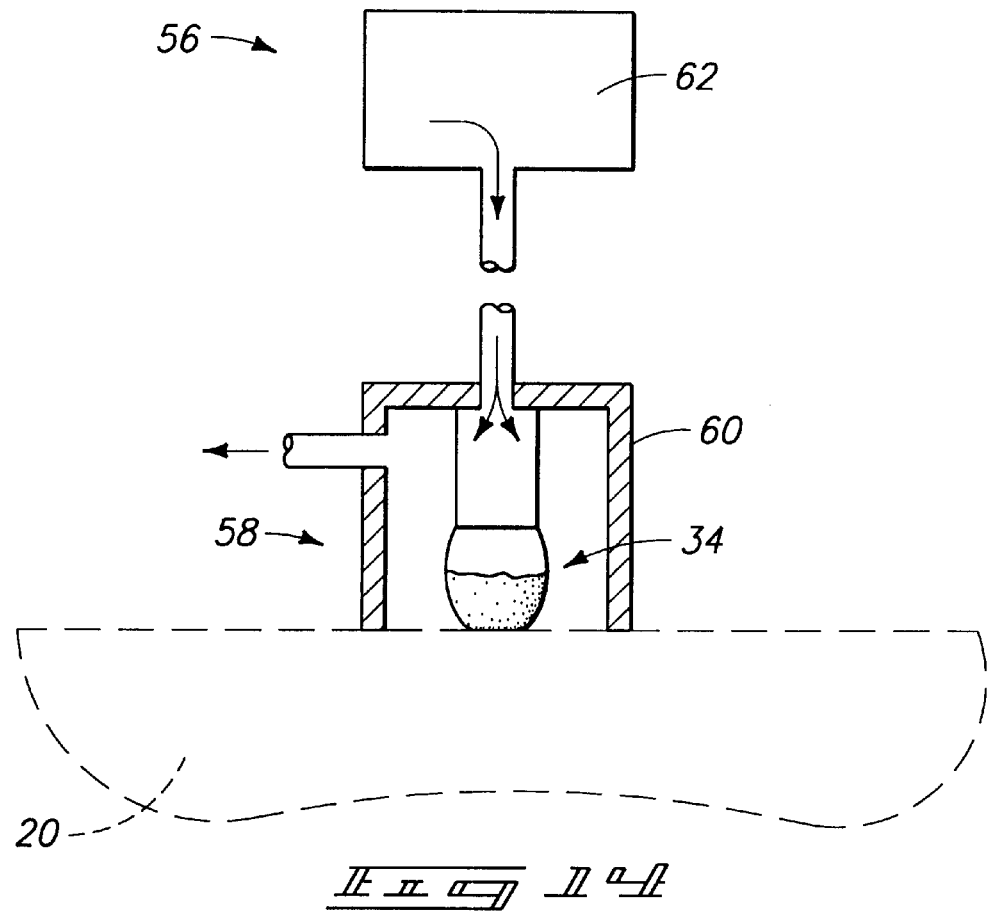
FIG. 14 is a view of portions of an etchant applicator constructed in accordance with one embodiment of the invention.

Referring to FIG. 14, a liquid etchant applicator assembly in accordance with another embodiment of the invention is shown generally at 56 and includes a tip portion 34 and an exhaust outlet 58 proximate tip portion 34. Exhaust outlet 58 is configured to remove material from around tip portion 34 during processing. The removed material can include either liquid or gaseous material which can be a by-product from the processing taking place. During treatment of a wafer portion 20 (shown in phantom), exhaust outlet 58 removes material from over the discrete area. Although not specifically shown, exhaust outlet 58 can have inlets through which material is provided for processing the wafer. In the illustrated example, the exhaust outlet comprises a vacuum device which is configured to remove gaseous material. For example, when processing with a liquid etchant material comprising hydrofluoric acid, fumes can often be generated which are removed through exhaust outlet 58. In the illustrated example, the exhaust outlet comprises a sheath 60 which can touch the wafer to form a seal therewith during removal of the desired material. In another embodiment, and one which does not necessarily require an exhaust outlet 58, a reservoir 62 is provided and is in fluid communication with tip portion 34. Accordingly, liquid etchant can be supplied to tip portion 34 without resort to dipping the tip portion into an amount of liquid etchant. Liquid etchant from reservoir 62 can be provided over tip portion 34 in any suitable fashion. Processing, of course, can take place as described above.

Figure 15:
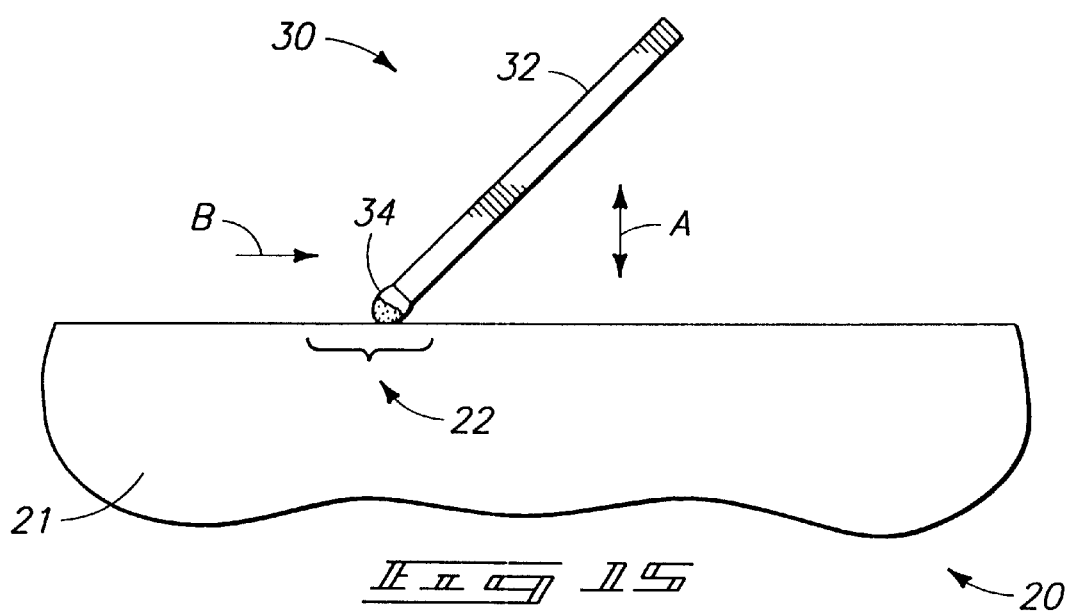
FIG. 15 is a view of a wafer fragment undergoing processing in accordance with one embodiment of the invention.

Referring to FIG. 15, etchant applicator 30 can be utilized to treat discrete area 22 of wafer 20 by dabbing (arrow A) the area with the tip portion, or by drawing (arrow B) applicator 30 across or through a desired discrete area. The wafer can be dabbed repeatedly with the applicator. In the case where applicator 30 is used to dab the wafer, and where the liquid etchant material comprises hydrofluoric acid, such dabbing can take place for no more than about one or two seconds. Longer treatment times can be utilized such as contacting the wafer for one minute or longer.

Methods and apparatuses of the above-described invention enable liquid etchant material, such as hydrofluoric acid, to be applied over a surface of a wafer with precision and accuracy. Such provides for the dispensing of a small amount of chemical etchant onto a surface to be etched in a highly localized area. Chemicals can be dispensed with little or no equipment to regulate flows, such as in conventional nozzle-like fluid dispensing apparatuses. In addition, the etchant applicator can be disposable and/or can contain its own fluid reservoir, thereby resulting in considerable equipment savings.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of removing material from discrete areas on a wafer during processing comprising:
   suspending a liquid etchant material proximate a tip portion of an etchant applicator;
   moving the etchant applicator and suspended liquid sufficiently close to a discrete area on a wafer to transfer at least some suspended liquid etchant material onto the discrete area; and
   retaining the liquid etchant material within the discrete area without using a physical barrier as part of the etchant applicator.

2. The method of claim 1, wherein the tip portion comprises a fluid permeable material.

3. The method of claim 1, wherein the tip portion comprises a fluid permeable material having a plurality of fibrous members.

4. The method of claim 1, wherein the tip portion comprises a fluid permeable material and the suspending comprises absorbing liquid etchant onto the material.

5. The method of claim 1, wherein the tip portion comprises a fluid permeable material and the suspending comprises absorbing liquid etchant through the material.

6. The method of claim 1, wherein the tip portion comprises a hollow opening and the suspending comprises projecting a droplet portion of the liquid etchant material outward of the hollow opening.

7. The method of claim 1, wherein the moving of the etchant applicator comprises touching the discrete area with the tip portion.

8. A method of removing material from discrete areas on a wafer during processing comprising:
   providing an etchant applicator having a tip portion;
   providing an amount of etchant material over the tip portion, the etchant material being supported by the tip portion;
   placing the tip portion into proximity with a discrete area of a wafer sufficiently to bring at least some of the supported etchant material into physical contact with the discrete area;
   removing the tip portion from the wafer, at least some of the supported etchant material being left behind thereon; and
   retaining any liquid portion of the etchant material within the discrete area without using a physical barrier as part of the etchant applicator.

9. The method of claim 8, wherein the tip portion comprises a fluid-absorbent material.

10. The method of claim 8, wherein:
    the tip portion comprises a fluid-absorbent material;
    the providing of the amount of etchant material comprises absorbing the amount of etchant material onto the tip portion; and
    the placing of the tip portion comprises touching the discrete area with at least some of the fluid-absorbent material.

11. The method of claim 8, wherein the tip portion comprises a wick assembly.

12. The method of claim 8, wherein the tip portion comprises a wick assembly having a plurality of fibers.

13. The method of claim 8, wherein the providing of the amount of etchant material comprises immersing the tip portion in an amount of the etchant material prior to the placing.

14. A method of removing material from discrete areas on a wafer during processing comprising:
    clinging a liquid etchant material onto an applicator tip portion;
    moving the applicator tip portion and clung liquid etchant to sufficiently proximate a discrete area on a wafer to cause removal of clung liquid etchant material from the tip portion and onto the discrete area; and
    retaining the liquid etchant material within the discrete area without using a physical barrier as part of the applicator tip portion.

15. The method of claim 14, wherein the applicator tip portion comprises a hollow opening and the clinging comprises projecting a droplet portion of the liquid etchant material outward of the hollow opening.

16. The method of claim 14, wherein the applicator tip portion comprises a fluid-absorbent material and the clinging comprises absorbing the liquid etchant material onto the fluid-absorbent material.

17. The method of claim 14, wherein the applicator tip portion comprises a fluid-permeable material, and the clinging comprises providing the liquid etchant material into the fluid-permeable material.

18. The method of claim 14, wherein the moving comprises touching the discrete area with the applicator tip portion.

19. The method of claim 14, wherein the moving comprises touching the discrete area only with etchant material and not any of the tip portion.

20. A method of removing material from discrete areas on a wafer during processing comprising:
    providing a liquid etchant applicator having a fluid-permeable tip portion;
    providing liquid etchant material over the fluid-permeable tip portion;
    moving the fluid-permeable tip portion into contact with a discrete area of a wafer;
    removing the fluid-permeable tip portion from the wafer, at least some of the liquid etchant material being left behind thereon; and
    retaining the liquid etchant material within the discrete area without using a physical barrier as part of the etchant applicator.

21. The method of claim 20, wherein the providing of the liquid etchant material over the fluid-permeable tip portion comprises dipping the tip portion in an amount of liquid etchant material.

22. The method of claim 20, wherein the fluid-permeable tip portion comprises fibrous material.

23. The method of claim 20, wherein the fluid permeable tip portion comprises a fluid-absorbent material.

24. The method of claim 20, wherein the fluid permeable tip portion comprises a fluid-absorbent material, and the providing of the liquid etchant material over the fluid-permeable tip portion comprises absorbing liquid etchant material within the tip portion.

25. A method of removing material from discrete areas on a wafer during processing comprising:
    providing a liquid etchant applicator having a wick assembly thereon configured for receiving an amount of liquid etchant;

supporting an amount of liquid etchant with said wick assembly;

transferring at least some of the liquid etchant from said wick assembly onto a discrete area on a wafer; and retaining the liquid etchant within the discrete area without using a physical barrier as part of the etchant applicator.

26. The method of claim 25, wherein the wick assembly comprises a fluid-absorbent material.

27. The method of claim 25, wherein the wick assembly comprises a plurality of fibrous members.

28. The method of claim 25, wherein said supporting comprises dipping a portion of said wick assembly into liquid etchant.

29. The method of claim 25, wherein said transferring comprises touching said discrete area with the wick assembly.

30. The method of claim 25, wherein said transferring comprises touching said discrete area with liquid etchant supported by the wick assembly.

31. A method of removing material from discrete areas on a wafer during processing comprising:

providing a liquid etchant applicator assembly comprising a fluid-permeable tip portion and an exhaust outlet proximate the tip portion, the exhaust outlet being configured to remove material from around the tip portion;

providing the fluid-permeable tip portion with liquid etchant material;

moving the fluid-permeable tip portion into contact with a discrete area of a wafer;

transferring at least some of the liquid etchant material from the fluid-permeable tip portion onto the wafer; retaining the liquid etchant material within the discrete area without reliance on any part of the etchant applicator as a physical barrier; and removing material from over the discrete area through the exhaust outlet.

32. The method of claim 31, wherein the exhaust outlet comprises a vacuum device configured to remove gaseous material.

33. The method of claim 31, wherein the exhaust outlet comprises a sheath and the removing comprises touching the wafer with the sheath.

34. The method of claim 31, wherein the fluid-permeable tip portion comprises a plurality of fibrous members.

35. The method of claim 31, wherein the providing of the fluid-permeable tip portion with liquid etchant material comprises providing a reservoir of etchant material in fluid communication with the tip portion.

36. A method of removing material from discrete areas on a wafer during processing comprising:

providing a liquid etchant applicator comprising a fluid-absorbent tip portion;

providing a liquid etchant reservoir in fluid communication with the fluid-absorbent tip portion;

absorbing liquid etchant from the reservoir onto the fluid-absorbent tip portion;

contacting a discrete area on a wafer with the fluid-absorbent tip portion, the contacting transferring some of the liquid etchant onto the discrete area; and retaining the liquid etchant within the discrete area without using a physical barrier as part of the etchant applicator.

37. The method of claim 36, wherein fluid-absorbent tip portion comprises a fibrous wick.

38. The method of claim 36, wherein the liquid etchant comprises hydrofluoric acid.

39. A method of removing material from discrete areas on a wafer during processing comprising:

providing a liquid etchant applicator having a fluid-permeable tip portion;

dipping at least some of the tip portion into an amount of liquid etchant material;

transferring at least some liquid etchant from the dipped tip portion onto a discrete area on a wafer; and retaining the liquid etchant material within the discrete area without using a physical barrier as part of the etchant applicator.

40. The method of claim 39, wherein the transferring comprises dabbing the discrete area with the tip portion, the dabbing placing the tip portion into physical contact with the discrete area for no more than two seconds.

41. The method of claim 39, wherein the transferring comprises dabbing the discrete area with the tip portion, the dabbing placing the tip portion into physical contact with the discrete area for no more than one second.

42. A method of removing material from over alignment marks on a wafer during processing comprising:

providing a substrate having a plurality of alignment marks thereover;

processing the substrate and depositing material over the alignment marks;

providing a liquid etchant applicator having a fluid-permeable tip portion;

providing liquid etchant material over the fluid-permeable tip portion;

moving the liquid etchant applicator into proximity with the alignment marks;

transferring at least some of the liquid etchant material from the fluid-permeable tip portion onto the material over the alignment marks; and retaining the liquid etchant material where transferred without using a physical barrier as part of the etchant applicator.

43. The method of claim 42, wherein the transferring comprises touching the wafer with the tip portion.

44. The method of claim 42, wherein the fluid-permeable tip portion comprises a plurality of fibers.

45. The method of claim 42, wherein the fluid-permeable tip portion comprises an absorbent material.

46. The method of claim 42, wherein the fluid-permeable tip portion comprises a wick assembly.

47. A method of removing material from discrete areas on a wafer during processing comprising:

providing a liquid etchant applicator having a fluid-permeable tip portion;

providing liquid etchant material over the fluid-permeable tip portion; dabbing a discrete area on a wafer with the tip portion sufficiently to transfer liquid etchant material onto the discrete area; and retaining the liquid etchant material within the discrete area without using a physical barrier as part of the etchant applicator.

48. The method of claim 47, wherein the dabbing comprises touching the discrete area with the tip portion for no longer than about two seconds.

49. The method of claim 47, wherein the dabbing comprises repeatedly touching the discrete area with the tip portion, at least one of the touchings comprising touching the discrete area for no longer than about two seconds.

50. A method of removing material from discrete areas on a wafer during processing comprising:

provipding a liquid etchant applicator having a fluid-permeable tip portion;

providing liquid etchant material over the fluid-permeable tip portion;

touching a discrete area on a wafer with the tip portion sufficiently to transfer liquid etchant material onto the discrete area;

while the tip portion is touching the wafer, moving the tip portion across a surface of the wafer; and retaining the liquid etchant material within the discrete area without using a physical barrier as part of the etchant applicator.

* * * * *